US010797649B2

United States Patent
Khlat (10) Patent No.: US 10,797,649 B2
(45) Date of Patent: Oct. 6, 2020

(54) MULTI-MODE ENVELOPE TRACKING AMPLIFIER CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/155,127

(22) Filed: Oct. 9, 2018

(65) Prior Publication Data

US 2019/0044480 A1 Feb. 7, 2019

Related U.S. Application Data

(63) Continuation of application No. 15/728,202, filed on Oct. 9, 2017, now Pat. No. 10,158,330.

(Continued)

(51) Int. Cl.
| | |
|---|---|
| H03F 1/02 | (2006.01) |
| H03F 3/195 | (2006.01) |
| H03F 3/21 | (2006.01) |
| H03F 1/30 | (2006.01) |
| H03F 3/213 | (2006.01) |
| H03F 3/24 | (2006.01) |

(52) U.S. Cl.
CPC ............ *H03F 1/0211* (2013.01); *H03F 1/30* (2013.01); *H03F 3/195* (2013.01); *H03F 3/211* (2013.01); *H03F 3/213* (2013.01); *H03F 3/245* (2013.01); *H03F 2200/102* (2013.01); *H03F 2200/111* (2013.01); *H03F 2200/216* (2013.01); *H03F 2200/231* (2013.01); *H03F 2200/252* (2013.01); *H03F 2200/267* (2013.01); *H03F 2200/432* (2013.01); *H03F 2200/447* (2013.01); *H03F 2200/451* (2013.01)

(58) Field of Classification Search
CPC ...................................... H03F 1/0211
USPC ...................................................... 330/127
See application file for complete search history.

(56) References Cited

U.S. PATENT DOCUMENTS

| 5,838,732 A | 11/1998 | Carney |
| 6,107,862 A | 8/2000 | Mukainakano et al. |

(Continued)

OTHER PUBLICATIONS

U.S. Appl. No. 15/704,131, filed Sep. 14, 2017.

(Continued)

*Primary Examiner* — Patricia T Nguyen
(74) *Attorney, Agent, or Firm* — Withrow & Terranova, P.L.L.C.

(57) ABSTRACT

A multi-mode envelope tracking (ET) amplifier circuit is provided. The multi-mode ET amplifier circuit can operate in a low-resource block (RB) mode, a mid-RB mode, and a high-RB mode. The multi-mode ET amplifier circuit includes fast switcher circuitry having a first switcher path and a second switcher path and configured to generate an alternating current (AC) current. A control circuit activates the fast switcher circuitry in the mid-RB mode and the high-RB mode, while deactivating the fast switcher circuitry in the low-RB mode. More specifically, the control circuit selectively activates one of the first switcher path and the second switcher path in the mid-RB mode and activates both the first switcher path and the second switcher path in the high-RB mode. As a result, it is possible to improve efficiency of ET tracker circuitry and the multi-mode ET amplifier circuit in all operation modes.

16 Claims, 5 Drawing Sheets

Related U.S. Application Data (60) Provisional application No. 62/533,177, filed on Jul. 17, 2017.

(56) References Cited

U.S. PATENT DOCUMENTS

| | | | |
|---|---|---|---|
| 7,043,213 | B2 | 5/2006 | Robinson et al. |
| 7,471,155 | B1 | 12/2008 | Levesque |
| 7,570,931 | B2 | 8/2009 | McCallister et al. |
| 8,461,928 | B2 | 6/2013 | Yahav et al. |
| 8,718,188 | B2 | 5/2014 | Balteanu et al. |
| 8,725,218 | B2 | 5/2014 | Brown et al. |
| 8,774,065 | B2 | 7/2014 | Khlat et al. |
| 8,803,603 | B2 | 8/2014 | Wimpenny |
| 8,818,305 | B1* | 8/2014 | Schwent .............. H03F 1/0227 455/127.5 |
| 8,879,665 | B2 | 11/2014 | Xia et al. |
| 8,913,690 | B2 | 12/2014 | Onishi |
| 8,989,682 | B2 | 3/2015 | Ripley et al. |
| 9,041,365 | B2 | 5/2015 | Kay et al. |
| 9,065,509 | B1 | 6/2015 | Yan et al. |
| 9,069,365 | B2 | 6/2015 | Brown et al. |
| 9,098,099 | B2 | 8/2015 | Park et al. |
| 9,166,830 | B2 | 10/2015 | Camuffo et al. |
| 9,167,514 | B2 | 10/2015 | Dakshinamurthy et al. |
| 9,197,182 | B2 | 11/2015 | Baxter et al. |
| 9,225,362 | B2 | 12/2015 | Drogi et al. |
| 9,247,496 | B2 | 1/2016 | Khlat |
| 9,263,997 | B2 | 2/2016 | Vinayak |
| 9,270,239 | B2 | 2/2016 | Drogi et al. |
| 9,271,236 | B2 | 2/2016 | Drogi |
| 9,280,163 | B2 | 3/2016 | Kay et al. |
| 9,288,098 | B2 | 3/2016 | Yan et al. |
| 9,344,304 | B1 | 5/2016 | Cohen |
| 9,356,512 | B2 | 5/2016 | Chowdhury et al. |
| 9,379,667 | B2 | 6/2016 | Khlat et al. |
| 9,515,622 | B2 | 12/2016 | Nentwig et al. |
| 9,520,907 | B2 | 12/2016 | Peng et al. |
| 9,584,071 | B2 | 2/2017 | Khlat |
| 9,595,981 | B2 | 3/2017 | Khlat |
| 9,596,110 | B2* | 3/2017 | Jiang .................. H03F 1/02 |
| 9,614,477 | B1 | 4/2017 | Rozenblit et al. |
| 9,748,845 | B1 | 8/2017 | Kotikalapoodi |
| 9,806,676 | B2 | 10/2017 | Balteanu et al. |
| 9,831,834 | B2 | 11/2017 | Balteanu et al. |
| 9,837,962 | B2* | 12/2017 | Mathe .................. H03F 1/02 |
| 9,923,520 | B1 | 3/2018 | Abdelfattah et al. |
| 10,003,416 | B1 | 6/2018 | Lloyd |
| 10,090,808 | B1 | 10/2018 | Henzler et al. |
| 10,110,169 | B2 | 10/2018 | Khesbak et al. |
| 10,158,330 | B1 | 12/2018 | Khlat |
| 10,170,989 | B2 | 1/2019 | Balteanu et al. |
| 10,291,181 | B2 | 5/2019 | Kim et al. |
| 2002/0167827 | A1 | 11/2002 | Umeda et al. |
| 2004/0266366 | A1 | 12/2004 | Robinson et al. |
| 2005/0090209 | A1 | 4/2005 | Behzad |
| 2005/0227646 | A1 | 10/2005 | Yamazaki et al. |
| 2005/0232385 | A1 | 10/2005 | Yoshikawa et al. |
| 2006/0240786 | A1 | 10/2006 | Liu |
| 2007/0052474 | A1 | 3/2007 | Saito |
| 2007/0258602 | A1 | 11/2007 | Vepsalainen et al. |
| 2009/0016085 | A1 | 1/2009 | Rader et al. |
| 2009/0045872 | A1 | 2/2009 | Kenington |
| 2009/0191826 | A1 | 7/2009 | Takinami et al. |
| 2010/0308919 | A1 | 12/2010 | Adamski et al. |
| 2011/0074373 | A1 | 3/2011 | Lin |
| 2011/0136452 | A1 | 6/2011 | Pratt et al. |
| 2011/0175681 | A1 | 7/2011 | Inamori et al. |
| 2011/0279179 | A1 | 11/2011 | Vice |
| 2012/0194274 | A1 | 8/2012 | Fowers et al. |
| 2012/0200435 | A1 | 8/2012 | Ngo et al. |
| 2012/0299645 | A1 | 11/2012 | Southcombe et al. |
| 2012/0299647 | A1 | 11/2012 | Honjo et al. |
| 2013/0021827 | A1 | 1/2013 | Ye |
| 2013/0100991 | A1 | 4/2013 | Woo |
| 2013/0130724 | A1 | 5/2013 | Kumar Reddy et al. |
| 2013/0162233 | A1 | 6/2013 | Marty |
| 2013/0187711 | A1 | 7/2013 | Goedken et al. |
| 2013/0200865 | A1 | 8/2013 | Wimpenny |
| 2013/0271221 | A1 | 10/2013 | Levesque et al. |
| 2014/0009226 | A1 | 1/2014 | Severson |
| 2014/0028370 | A1 | 1/2014 | Wimpenny |
| 2014/0028390 | A1 | 1/2014 | Davis |
| 2014/0057684 | A1 | 2/2014 | Khlat |
| 2014/0103995 | A1 | 4/2014 | Langer |
| 2014/0155002 | A1 | 6/2014 | Dakshinamurthy et al. |
| 2014/0184335 | A1 | 7/2014 | Nobbe et al. |
| 2014/0199949 | A1 | 7/2014 | Nagode et al. |
| 2014/0210550 | A1 | 7/2014 | Mathe et al. |
| 2014/0218109 | A1 | 8/2014 | Wimpenny |
| 2014/0235185 | A1 | 8/2014 | Drogi |
| 2014/0266423 | A1 | 9/2014 | Drogi et al. |
| 2014/0266428 | A1 | 9/2014 | Chiron et al. |
| 2014/0315504 | A1 | 10/2014 | Sakai et al. |
| 2014/0361830 | A1 | 12/2014 | Mathe et al. |
| 2015/0048883 | A1 | 2/2015 | Vinayak |
| 2015/0071382 | A1 | 3/2015 | Wu et al. |
| 2015/0098523 | A1* | 4/2015 | Lim .................... H03F 1/0227 375/297 |
| 2015/0155836 | A1 | 6/2015 | Midya et al. |
| 2015/0188432 | A1 | 7/2015 | Vannorsdel et al. |
| 2015/0236654 | A1 | 8/2015 | Jiang et al. |
| 2015/0236729 | A1 | 8/2015 | Peng et al. |
| 2015/0280652 | A1 | 10/2015 | Cohen |
| 2015/0333781 | A1 | 11/2015 | Alon et al. |
| 2016/0065137 | A1 | 3/2016 | Khlat |
| 2016/0099687 | A1 | 4/2016 | Khlat |
| 2016/0105151 | A1 | 4/2016 | Langer |
| 2016/0118941 | A1 | 4/2016 | Wang |
| 2016/0126900 | A1 | 5/2016 | Shute |
| 2016/0173031 | A1* | 6/2016 | Langer ................ H03F 1/0222 330/126 |
| 2016/0187627 | A1 | 6/2016 | Abe |
| 2016/0197627 | A1 | 7/2016 | Qin et al. |
| 2016/0294587 | A1 | 10/2016 | Jiang et al. |
| 2017/0141736 | A1 | 5/2017 | Pratt et al. |
| 2017/0302183 | A1 | 10/2017 | Young |
| 2017/0317913 | A1 | 11/2017 | Kim et al. |
| 2017/0338773 | A1 | 11/2017 | Balteanu et al. |
| 2018/0048265 | A1* | 2/2018 | Nentwig ............... H03F 3/217 |
| 2018/0048276 | A1 | 2/2018 | Khlat |
| 2018/0076772 | A1 | 3/2018 | Khesbak et al. |
| 2018/0288697 | A1* | 10/2018 | Camuffo ............. H03F 1/0227 |
| 2018/0302042 | A1 | 10/2018 | Zhang et al. |
| 2018/0309414 | A1 | 10/2018 | Khlat et al. |
| 2018/0367101 | A1 | 12/2018 | Chen et al. |
| 2019/0068234 | A1 | 2/2019 | Khlat et al. |
| 2019/0097277 | A1 | 3/2019 | Fukae |
| 2019/0109566 | A1 | 4/2019 | Folkmann et al. |
| 2019/0109613 | A1 | 4/2019 | Khlat et al. |

OTHER PUBLICATIONS

U.S. Appl. No. 15/728,202, filed Oct. 9, 2017.
U.S. Appl. No. 15/792,909, filed Oct. 25, 2017.
U.S. Appl. No. 15/888,260, filed Feb. 5, 2018.
U.S. Appl. No. 15/888,300, filed Feb. 5, 2018.
U.S. Appl. No. 15/984,566, filed May 21, 2018.
U.S. Appl. No. 15/986,948, filed May 23, 2018.
U.S. Appl. No. 16/018,426, filed Jun. 26, 2018.
U.S. Appl. No. 15/902,244, filed Feb. 22, 2018.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.

(56) References Cited

OTHER PUBLICATIONS

Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Final Office Action for U.S. Appl. No. 15/888,300, dated Feb. 15, 2019, 15 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Pfister, Henry, "Discrete-Time Signal Processing," Lecture Note, pfister.ee.duke.edu/courses/ece485/dtsp.pdf, Mar. 3, 2017, 22 pages.
Advisory Action for U.S. Appl. No. 15/888,300, dated Jun. 5, 2019, 3 pages.
Non-Final Office Action for U.S. Appl. No. 15/888,260, dated May 2, 2019, 14 pages.
Notice of Allowance for U.S. Appl. No. 15/984,566, dated May 21, 2019, 6 pages.
Final Office Action for U.S. Appl. No. 15/986,948, dated Aug. 27, 2019, 9 pages.
Final Office Action for U.S. Appl. No. 16/018,426, dated Sep. 4, 2019, 12 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.

* cited by examiner

MULTI-MODE ENVELOPE TRACKING AMPLIFIER CIRCUIT

RELATED APPLICATIONS

This application is a continuation of U.S. patent application Ser. No. 15/728,202, filed on Oct. 9, 2017, now U.S. Pat. No. 10,158,330, which claims the benefit of U.S. Provisional Patent Application Ser. No. 62/533,177, filed on Jul. 17, 2017, which is incorporated herein by reference in its entirety.

FIELD OF THE DISCLOSURE

The technology of the disclosure relates generally to power management in wireless communication devices.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as long-term evolution (LTE). To achieve the higher data rates in mobile communication devices, sophisticated power amplifiers (PAs) may be employed to increase output power of radio frequency (RF) signals (e.g., maintaining sufficient energy per bit) communicated by mobile communication devices. However, the increased output power of RF signals can lead to increased power consumption and thermal dissipation in mobile communication devices, thus compromising overall performance and user experiences.

Envelope tracking is a power management technology designed to improve efficiency levels of PAs to help reduce power consumption and thermal dissipation in mobile communication devices. As the name suggests, envelope tracking employs a system that keeps track of the amplitude envelope of the RF signals communicated by mobile communication devices. The envelope tracking system constantly adjusts supply voltage applied to the PAs to ensure that the PAs are operating at a higher efficiency for a given instantaneous output power requirement of the RF signals. In addition, it can help to further improve efficiency of the PAs by minimizing electrical currents sourced from the PAs.

SUMMARY

Aspects disclosed in the detailed description include a multi-mode envelope tracking (ET) amplifier circuit. The multi-mode ET amplifier circuit can operate in a low-resource block (RB) mode, a mid-RB mode, and a high-RB mode. The multi-mode ET amplifier circuit includes ET tracker circuitry to provide an ET modulated voltage to an output node and fast switcher circuitry to generate an alternating current (AC) current. The fast switcher circuitry includes a first switcher path and a second switcher path. A control circuit activates the fast switcher circuitry in the mid-RB mode and the high-RB mode, while deactivating the fast switcher circuitry in the low-RB mode. More specifically, the control circuit activates the fast switcher circuitry to provide the AC current to the output node via one of the first switcher path and the second switcher path in the mid-RB mode, while activating the fast switcher circuitry to provide the AC current to the output node via both the first switcher path and the second switcher path in the high-RB mode. Accordingly, a power amplifier circuit(s) coupled to the output node can amplify a radio frequency (RF) signal based on the ET modulated voltage and the AC current. As a result, it is possible to improve efficiency of the ET tracker circuitry and the multi-mode ET amplifier circuit in all operation modes.

In one aspect, a multi-mode ET amplifier circuit is provided. The multi-mode ET amplifier circuit includes an output node. The multi-mode ET amplifier circuit also includes at least one power amplifier circuit coupled to the output node and configured to amplify an RF signal. The multi-mode ET amplifier circuit also includes ET tracker circuitry configured to provide an ET modulated voltage to the output node. The multi-mode ET amplifier circuit also includes fast switcher circuitry comprising a first switcher path and a second switcher path and configured to generate an AC current. The multi-mode ET amplifier circuit also includes a control circuit. The control circuit is configured to deactivate the fast switcher circuitry in a low-RB mode. The control circuit is also configured to activate the fast switcher circuitry to provide the AC current to the output node via a selected switcher path among the first switcher path and the second switcher path in a mid-RB mode in which the RF signal comprises more RBs than in the low-RB mode. The control circuit is also configured to activate the fast switcher circuitry to provide the AC current to the output node via the first switcher path and the second switcher path in a high-RB mode in which the RF signal comprises more RBs than in the mid-RB mode.

In another aspect, a multi-mode ET amplifier circuit is provided. The multi-mode ET amplifier circuit includes a first output node and a second output node. The multi-mode ET amplifier circuit also includes at least one power amplifier circuit configured to amplify an RF signal. The at least one power amplifier circuit includes a driver stage power amplifier and an output stage differential power amplifier comprising a plus power amplifier and a minus power amplifier. The multi-mode ET amplifier circuit also includes first ET tracker circuitry configured to provide a first ET modulated voltage to the first output node. The multi-mode ET amplifier circuit also includes second ET tracker circuitry configured to provide a second ET modulated voltage to the second output node. The multi-mode ET amplifier circuit also includes first fast switcher circuitry configured to provide a first AC current to the first output node. The multi-mode ET amplifier circuit also includes second fast switcher circuitry configured to provide a second AC current to the second output node. The multi-mode ET amplifier circuit also includes a control circuit. The control circuit is configured to deactivate the first fast switcher circuitry and the second fast switcher circuitry in a low-RB mode. The control circuit is also configured to activate the first fast switcher circuitry to provide the first AC current to the first output node in a mid-RB mode and a high-RB mode in which the RF signal comprises more RBs than in the low-RB mode. The control circuit is also configured to activate the second fast switcher circuitry to provide the second AC current to the second output node in the mid-RB mode and the high-RB mode in which the RF signal comprises more RBs than in the mid-RB mode.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include a multi-mode envelope tracking (ET) amplifier circuit. The multi-mode ET amplifier circuit can operate in a low-resource block (RB) mode, a mid-RB mode, and a high-RB mode. The multi-mode ET amplifier circuit includes ET tracker circuitry to provide an ET modulated voltage to an output node and fast switcher circuitry to generate an alternating current (AC) current. The fast switcher circuitry includes a first switcher path and a second switcher path. A control circuit activates the fast switcher circuitry in the mid-RB mode and the high-RB mode, while deactivating the fast switcher circuitry in the low-RB mode. More specifically, the control circuit activates the fast switcher circuitry to provide the AC current to the output node via one of the first switcher path and the second switcher path in the mid-RB mode, while activating the fast switcher circuitry to provide the AC current to the output node via both the first switcher path and the second switcher path in the high-RB mode. Accordingly, a power amplifier circuit(s) coupled to the output node can amplify a radio frequency (RF) signal based on the ET modulated voltage and the AC current. As a result, it is possible to improve efficiency of ET tracker circuitry and the multi-mode ET amplifier circuit in all operation modes.

Figure 1:
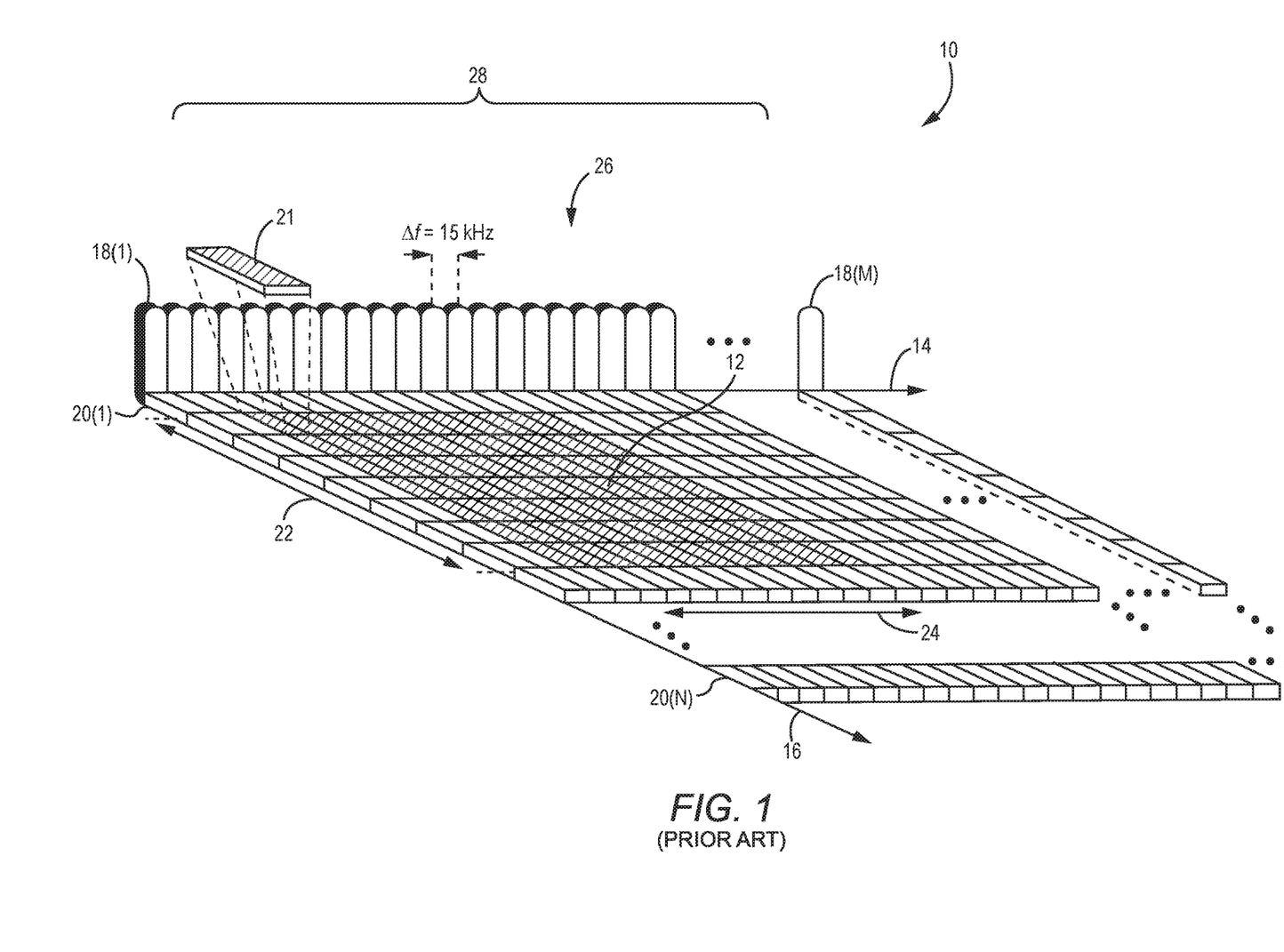
FIG. 1 is a schematic diagram of an exemplary orthogonal frequency division multiplexing (OFDM) time-frequency grid illustrating at least one resource block (RB)

Before discussing the multi-mode ET amplifier circuit of the present disclosure, a brief overview of an RB-based resource allocation scheme is first provided with reference FIG. 1 to help understand the relationship between bandwidth of an RF signal and the number of RBs allocated to the RF signal. A brief discussion of a conventional ET amplifier circuit for amplifying an RF signal is then provided with reference to FIG. 2. The discussion of specific exemplary aspects of a multi-mode ET amplifier circuit starts below with reference to FIG. 3.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there is a plurality of subcarriers 18(1)-18(M). The subcarriers 18(1)-18(M) are orthogonally separated from each other by a frequency spacing Δf of 15 KHz. Along the time axis 16, there is a plurality of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals a one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE) and fifth-generation new radio (5G-NR), the RB 12 is the minimum unit for allocating resources to users.

In an LTE system, an RF signal 26 can occupy multiple subcarriers among the subcarriers 18(1)-18(N). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, a power amplifier circuit would need to operate fast enough to keep up with the faster amplitude variations of the RF signal 26 across the signal bandwidth 28 within the RB duration 22. Accordingly, a circuit providing ET modulated voltage to the power amplifier circuit needs to provide the ET modulation at a faster frequency (e.g., 250 MHz or above) to keep up with the fast operation of the power amplifier circuit.

Figure 2:
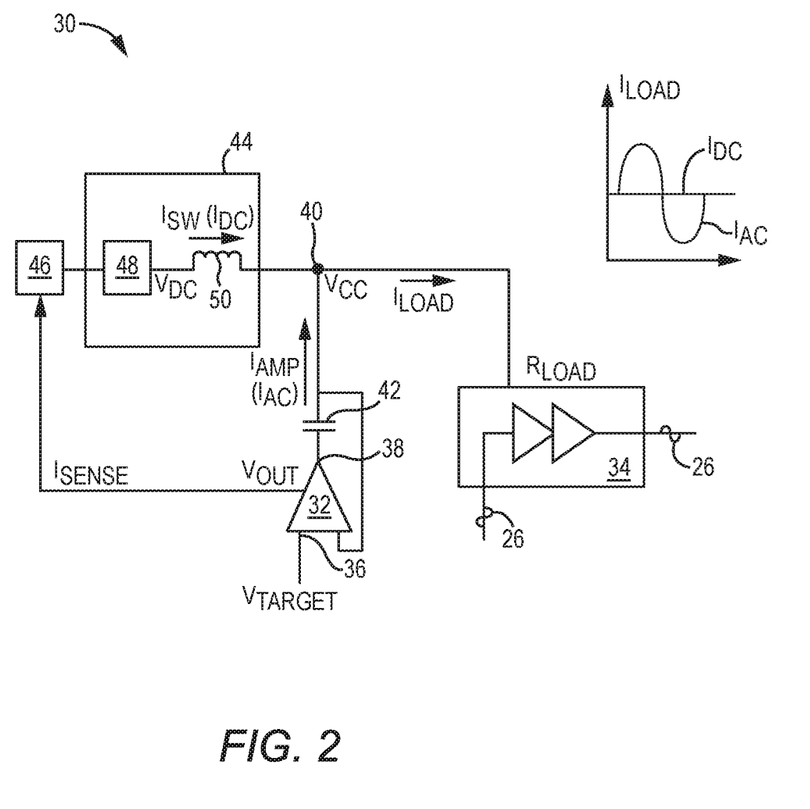
FIG. 2 is a schematic diagram of an exemplary conventional envelope tracking (ET) amplifier circuit including ET tracker circuitry configured to provide an ET modulated voltage to at least one power amplifier circuit for amplifying the RF signal of FIG. 1.

In this regard, FIG. 2 is a schematic diagram of an exemplary conventional ET amplifier circuit 30 including ET tracker circuitry 32 configured to provide an ET modulated voltage $V_{CC}$ to at least one power amplifier circuit 34 for amplifying the RF signal 26 of FIG. 1. Elements of FIG. 1 are referenced in conjunction with FIG. 2 and will not be re-described herein.

The ET tracker circuitry 32 includes a tracker input 36 and a tracker output 38. The ET tracker circuitry 32 receives an ET modulated target voltage $V_{TARGET}$ at the tracker input 36 and generates an ET modulated output voltage $V_{OUT}$, which tracks the ET modulated target voltage $V_{TARGET}$, at the tracker output 38. The tracker output 38 is coupled to an output node 40 via an offset capacitor 42. The offset capacitor 42 is configured to convert the ET modulated output voltage $V_{OUT}$ into the ET modulated voltage $V_{CC}$ at the output node 40. In a non-limiting example, the ET modulated voltage $V_{CC}$ is one volt (1V) higher than the ET modulated output voltage $V_{OUT}$.

In the conventional ET amplifier circuit 30, the ET modulated target voltage $V_{TARGET}$ provides a target voltage envelope for the ET modulated voltage $V_{CC}$, which serves as a supply voltage to the power amplifier circuit 34 for amplifying the RF signal 26. As previously discussed in FIG. 1, the RF signal 26 may have faster amplitude variations within the RB duration 22 when the RF signal 26 contains a higher number of RBs 12 (e.g., more than 100 RBs). As such, the ET modulated voltage $V_{CC}$ needs to change at a faster frequency within the RB duration 22 ($dV_{OUT}/dt$) to keep up with the faster amplitude variations of the RF signal 26.

The power amplifier circuit 34 is coupled to the output node 40 to receive the ET modulated voltage VCC. The power amplifier circuit 34 has a load line $R_{LOAD}$, which induces a load current $I_{LOAD}$ based on the ET modulated voltage $V_{CC}$ (e.g., $I_{LOAD}=V_{CC}\div R_{LOAD}$). The load current $I_{LOAD}$ includes a DC current $I_{DC}$ and an AC current $I_{AC}$. The AC current $I_{AC}$ has an AC current frequency that tracks the variations of the ET modulated voltage $V_{CC}$. In this regard, the AC current frequency is higher when the RF signal 26 contains more than 100 RBs, and is lower when the RF signal 26 contains less than or equal to 100 RBs.

The conventional ET amplifier circuit 30 includes switcher circuitry 44 and a control circuit 46 configured to control the switcher circuitry 44. The switcher circuitry 44 includes a DC-DC converter 48 and an inductor 50. The DC-DC converter 48 is configured to generate a DC voltage $V_{DC}$. The inductor 50, which can have an inductance L between 1.1 microHenry (1.1 μH) and 2.2 μH for example, induces a switcher current $I_{SW}$. The switcher current $I_{SW}$ has a switcher current frequency $dI_{SW}/dt$ that can be determined based on the equation (Eq. 1) below.

$$dI_{SW}/dt=(V_{DC}-V_{CC})/L \qquad \text{(Eq. 1)}$$

As can be seen from the equation (Eq. 1) above, the switcher current frequency $dI_{SW}/dt$ is inversely related to the inductance L of the inductor 50. Given that the inductance L of the inductor 50 needs to be large enough to help reduce noise degradation, the switcher current frequency $dI_{SW}/dt$ may not be fast enough to keep up with modulation changes of the ET modulated voltage $V_{CC}$ when the RF signal 26 contains more than 100 RBs. As such, the switcher circuitry 44 would only be able to provide the switcher current $I_{SW}$ as the DC current $I_{DC}$ in the load current $I_{LOAD}$. Consequently, the ET tracker circuitry 32 will be forced to supply the AC current $I_{AC}$ in the load current $I_{LOAD}$, thus compromising efficiency of the ET tracker circuitry 32.

The ET tracker circuitry 32 provides a sense current $I_{SENSE}$, which is proportional to the AC current $I_{AC}$, to the control circuit 46. The control circuit 46 relies on the sense current $I_{SENSE}$ to detect the AC current $I_{AC}$ generated by the ET tracker circuitry 32, and controls the switcher circuitry 44 to adjust the switcher current $I_{SW}$ in an effort to minimize the AC current $I_{AC}$. In this regard, when the ET tracker circuitry 32 increases the AC current $I_{AC}$, the sense current $I_{SENSE}$ would also increase proportionally. The increased sense current $I_{SENSE}$ can cause parasitic capacitance to increase in field-effect transistors (FETs) contained in the switcher circuitry 44, thus further reducing the efficiency of the switcher circuitry 44. In this regard, it may be desired to minimize the AC current $I_{AC}$ generated by the ET tracker circuitry 32 under all operating conditions, especially when the RF signal 26 contains more than 100 RBs.

Figure 3:
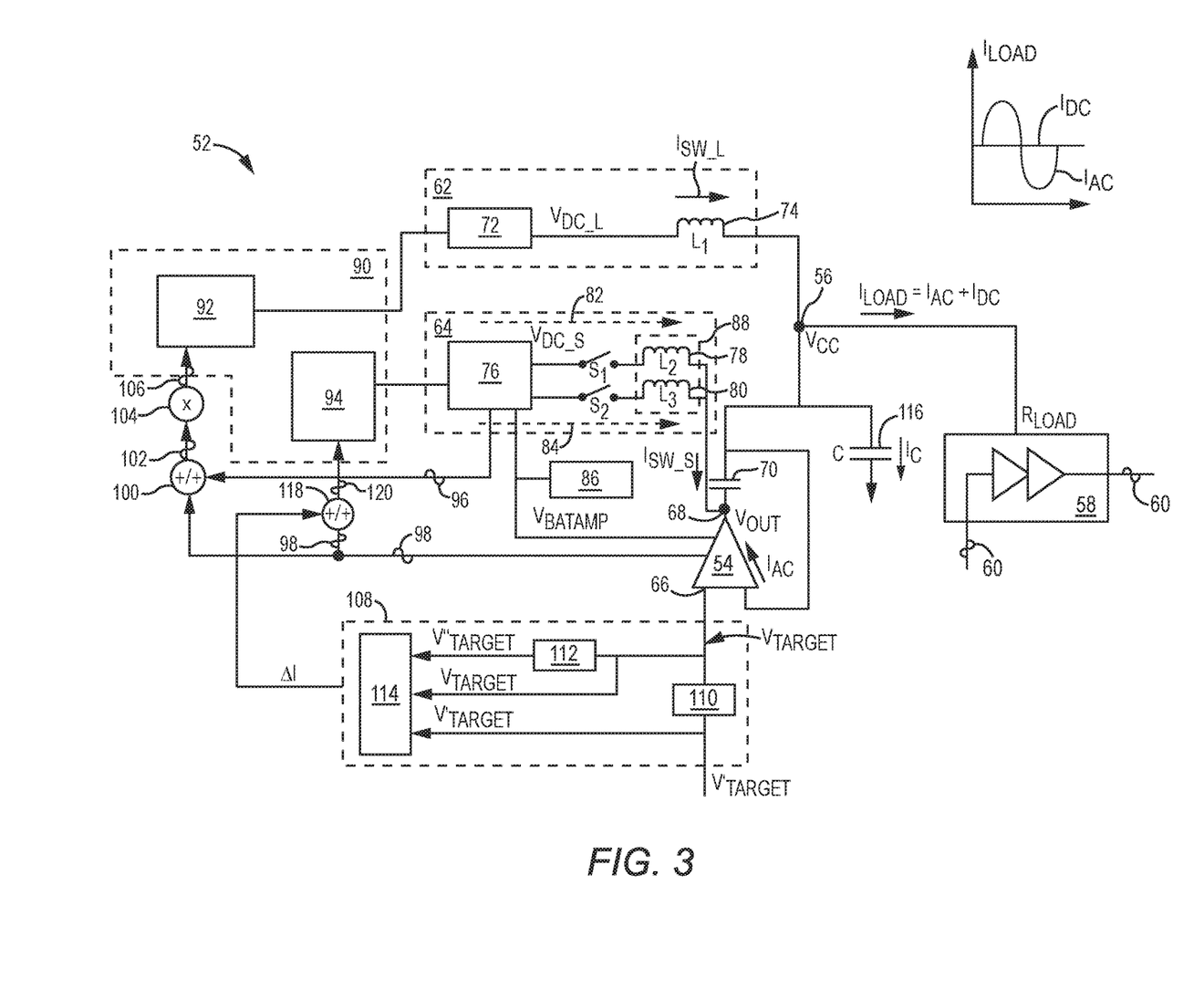
FIG. 3 is a schematic diagram of an exemplary multi-mode ET amplifier circuit that can operate with an improved efficiency greater than the conventional ET amplifier circuit of FIG. 2 in low-resource block (RB) mode, mid-RB mode, and high-RB mode.

In this regard, FIG. 3 is a schematic diagram of an exemplary multi-mode ET amplifier circuit 52 including ET tracker circuitry 54 that can operate with improved efficiency greater than the ET tracker circuitry 32 in the conventional ET amplifier circuit 30 of FIG. 2 in a low-RB mode, a mid-RB mode, and a high-RB mode. The multi-mode ET amplifier circuit 52 includes an output node 56 coupled to at least one power amplifier circuit 58. In a non-limiting example, the power amplifier circuit 58 can be a serial amplifier circuit, which includes a driver stage amplifier and an output stage amplifier coupled in tendon, or a differential amplifier circuit, which includes a driver stage amplifier and an output stage differential amplifier coupled in tendon. The power amplifier circuit 58 is configured to amplify an RF signal 60 to a determined power.

In examples discussed herein, the multi-mode ET amplifier circuit 52 operates in the low-RB mode when the RF signal 60 includes less than or equal to 100 RBs (≤100 RBs). The multi-mode ET amplifier circuit 52 operates in the mid-RB mode when the RF signal 60 includes more than 100 RBs but less than 300 RBs (>100 RBs and <300 RBs). The multi-mode ET amplifier circuit 52 operates in the high-RB mode when the RF signal 60 includes greater than or equal to 300 RBs (≥300 RBs).

The multi-mode ET amplifier circuit 52 includes slow switcher circuitry 62, which is functionally equivalent to the switcher circuitry 44 in FIG. 2 and typically operates in the low-RB mode. The multi-mode ET amplifier circuit 52 also includes fast switcher circuitry 64 configured to operate only in the mid-RB mode and the high-RB mode. As is further discussed below, the fast switcher circuitry 64 can be activated in the mid-RB mode and the high-RB mode to help minimize AC current supplied by the ET tracker circuitry 54, thus improving operating efficiency of the ET tracker circuitry 54 and the multi-mode ET amplifier circuit 52 as a whole.

The ET tracker circuitry 54, which can be functionally equivalent to the ET tracker circuitry 32 of FIG. 2, includes a tracker input 66 and a tracker output 68. The ET tracker circuitry 54 receives an ET modulated target voltage $V_{TARGET}$ at the tracker input 66 and generates an ET modulated output voltage $V_{OUT}$, which tracks the ET modulated target voltage $V_{TARGET}$, at the tracker output 68. The tracker output 68 is coupled to the output node 56 via an offset capacitor 70. The offset capacitor 70 is configured to convert the ET modulated output voltage $V_{OUT}$ into the ET modulated voltage $V_{CC}$ at the output node 56. In a non-limiting example, the ET modulated voltage $V_{CC}$ is one volt (1 V) higher than the ET modulated output voltage $V_{OUT}$.

In the multi-mode ET amplifier circuit 52, the ET modulated target voltage $V_{TARGET}$ provides a target voltage envelope for the ET modulated voltage $V_{CC}$, which serves as a supply voltage to the power amplifier circuit 58 for amplifying the RF signal 60. The power amplifier circuit 58 has a load line $R_{LOAD}$, which induces a load current $I_{LOAD}$ based on the ET modulated voltage $V_{CC}$ (e.g., $I_{LOAD} = V_{CC} \div R_{LOAD}$). As previously discussed in FIG. 2, the load current $I_{LOAD}$ includes the DC current $I_{DC}$ and the AC current $I_{AC}$.

The slow switcher circuitry 62 includes a first DC-DC converter 72 and a first inductor 74. The first DC-DC converter 72 is configured to generate a first DC voltage $V_{DC\_L}$. The first inductor 74, which can have a first inductance $L_1$ between 1.1 µH and 2.2 µH for example, induces a DC current $I_{SW\_L}$.

The fast switcher circuitry 64 includes a second DC-DC converter 76, a second inductor 78, and a third inductor 80. The second DC-DC converter 76 and the second inductor 78 form a first switcher path 82. The second DC-DC converter 76 and the third inductor 80 form a second switcher path 84. The second DC-DC converter 76 is configured to generate a second DC voltage $V_{DC\_S}$ based on a supply voltage $V_{BATAMP}$ supplied by an inductor-based buck-boost circuit 86. The second inductor 78, which has a second inductance $L_2$ between 100 nanoHenry (nH) and 200 nH and the third inductor 80, which has a third inductance $L_3$ between 100 nH and 200 nH, induces an AC current $I_{SW\_S}$. The second inductance $L_2$ and the third inductance $L_3$ can be equal or different. In a non-limiting example, the second inductor 78 and the third inductor 80 are disposed in parallel between the second DC-DC converter 76 and the tracker output 68 to form an inductor pair 88. When activated, the fast switcher circuitry 64 can provide the AC current $I_{SW\_S}$ to the tracker output 68 and subsequently to the output node 56 via the offset capacitor 70. Thus, the fast switcher circuitry 64 can supply the AC current $I_{AC}$ in the load current $I_{LOAD}$. As a result, it is possible to minimize the AC current supplied by the ET tracker circuitry 54, thus helping to improve the operating efficiency of the ET tracker circuitry 54.

The multi-mode ET amplifier circuit 52 includes a control circuit 90. The control circuit 90 includes a slow switcher controller 92 coupled to the slow switcher circuitry 62 and a fast switcher controller 94 coupled to the fast switcher circuitry 64. In a non-limiting example, the slow switcher controller 92 and the fast switcher controller 94 are both provided as bang-band controllers (BBCs).

The slow switcher controller 92 is configured to activate the slow switcher circuitry 62 in the low-RB mode, the mid-RB mode, and the high-RB mode to provide the DC current $I_{SW\_L}$ to the output node 56 as the DC current $I_{DC}$ in the load current $I_{LOAD}$.

The fast switcher controller 94 is configured to activate the fast switcher circuitry 64 to provide the AC current $I_{SW\_S}$ to the tracker output 68 and subsequently to the output node 56 as the AC current $I_{AC}$ in the load current $I_{LOAD}$. More specifically, in the mid-RB mode, the fast switcher controller 94 controls the fast switcher circuitry 64 to provide the AC current $I_{SW\_S}$ through a selected switcher path between the first switcher path 82 and the second switcher path 84. For example, the fast switcher controller 94 can select the first switcher path 82 by closing switch $S_1$ and opening switch $S_2$ or select the second switcher path 84 by opening switch $S_1$ and closing switch $S_2$.

In the high-RB mode, the fast switcher controller 94 controls the fast switcher circuitry 64 to provide the AC current $I_{SW\_S}$ through both the first switcher path 82 and the second switcher path 84 by concurrently closing switch $S_1$ and switch $S_2$. Given that the second inductor 78 and the third inductor 80 are disposed in parallel, inductance of the inductor pair 88 would be smaller than the second inductance $L_2$ and the third inductance $L_3$. As such, the fast switcher circuitry 64 can support higher switcher current frequency $dI_{SW\_S}/dt$ compared to providing the AC current $I_{SW\_S}$ through the selected switcher path between the first switcher path 82 and the second switcher path 84. When the multi-mode ET amplifier circuit 52 is operating in the low-RB mode, the fast switcher controller 94 deactivates the fast switcher circuitry 64.

The fast switcher controller 94 can be configured to activate or deactivate the fast switcher circuitry 64 based on whether the ET tracker circuitry 54 is forced to generate the AC current $I_{AC}$. Specifically, the fast switcher controller 94 may activate the fast switcher circuitry 64 in response to determining that the ET tracker circuitry 54 is sourcing the AC current $I_{AC}$ to the output node 56. The control circuit 90 may deactivate the fast switcher circuitry 64 in response to determining that the ET tracker circuitry 54 is sinking the AC current $I_{AC}$ from the output node 56.

Given that the amplitude variations of the RF signal 60 can be slower in the low-RB mode as opposed to being faster in the mid-RB mode and the high-RB mode, the slow switcher circuitry 62 may be able to supply the AC current $I_{AC}$ in the low-RB mode in addition to supplying the DC current $I_{DC}$. As such, the slow switcher controller 92 may control the slow switcher circuitry 62 to provide the AC current $I_{AC}$ to the output node 56, thus helping to minimize the AC current $I_{AC}$ supplied by the ET tracker circuitry 54, which further helps to improve the operating efficiency of the ET tracker circuitry 54 in the low-RB mode.

The fast switcher circuitry 64 can be configured to generate a switcher sense current 96 that is in proportion to the AC current $I_{SW\_S}$ generated by the fast switcher circuitry 64. Likewise, the ET tracker circuitry 54 can be configured to generate a tracker sense current 98 that is in proportion to the AC current $I_{AC}$ sourced or sank by the ET tracker circuitry 54. The tracker sense current 98 is a positive current when the ET tracker circuitry 54 is sourcing the AC current $I_{AC}$. In contrast, the tracker sense current 98 is a negative current when the ET tracker circuitry 54 is sinking the AC current $I_{AC}$.

In a non-limiting example, the fast switcher controller 94 receives the tracker sense current 98 from the ET tracker circuitry 54. The fast switcher controller 94 can control the fast switcher circuitry 64 to increase the AC current $I_{SW\_S}$ in response to the tracker sense current 98 being the positive current. In contrast, the fast switcher controller 94 can control the fast switcher circuitry 64 to decrease the AC current $I_{SW\_S}$ in response to the tracker sense current 98 being the negative current.

More specifically, the fast switcher controller 94 can utilize a first positive current threshold and a second positive current threshold that is higher than the first positive current threshold to help determine whether the multi-mode ET amplifier circuit 52 is operating in the mid-RB mode or the high-RB mode. If the tracker sense current 98 is higher than the first positive current threshold but lower than the second positive current threshold, the fast switcher controller 94 can determine that the multi-mode ET amplifier circuit 52 is operating in the mid-RB mode. Accordingly, the fast switcher controller 94 can activate the selected switcher path between the first switcher path 82 and the second switcher path 84 to provide the AC current $I_{SW\_S}$ to the output node 56 as the AC current $I_{AC}$. If the tracker sense current 98 is higher than the second positive current threshold, the fast switcher controller 94 can determine that the multi-mode ET amplifier circuit 52 is operating in the high-RB mode. Accordingly, the fast switcher controller 94 actives both the first switcher path 82 and the second switcher path 84 to provide the AC current $I_{SW\_S}$ to the output node 56 as the AC current $I_{AC}$. In contrast, if the tracker sense current 98 is below the first positive current threshold, the fast switcher controller 94 can determine that the multi-mode ET amplifier circuit 52 is operating in the low-RB mode. Accordingly, the fast switcher controller 94 deactivates the first switcher path 82 and the second switcher path 84.

The slow switcher controller 92 is configured to receive the switcher sense current 96 and the tracker sense current 98 from the fast switcher circuitry 64 and the ET tracker circuitry 54, respectively. The slow switcher controller 92 controls the slow switcher circuitry 62 to adjust the DC current $I_{SW\_L}$ based on the switcher sense current 96 and the tracker sense current 98.

The multi-mode ET amplifier circuit 52 includes a current combiner 100 configured to receive and combine the switcher sense current 96 and the tracker sense current 98 to generate a combined sense current 102. The multi-mode ET amplifier circuit 52 also includes a gain regulator 104 provided between the current combiner 100 and the slow switcher controller 92. The gain regulator 104 receives the combined sense current 102 from the current combiner 100 and scales the combined sense current 102 based on a scaling factor to generate a scaled sense current 106. The gain regulator 104 is further configured to provide the scaled sense current 106 to the slow switcher controller 92 for controlling the slow switcher circuitry 62.

The gain regulator 104 is provided to keep the amount of the combined sense current 102 relatively stable between the low-RB mode and the mid-RB mode or the high-RB mode. In a non-limiting example, the scaling factor is set to one in the low-RB mode and less than one in the mid-RB mode or the high-RB mode. In a non-limiting example, the scaling factor can be greater than $\frac{1}{30}$ and less than one in the mid-RB mode, and less than $\frac{1}{30}$ in the high-RB mode. The scaling factor can be set to one in the low-RB mode, because the combined sense current 102 would be smaller as a result of the fast switcher circuitry 64 being deactivated and the switcher sense current 96 being eliminated. In contrast, in the mid-RB and the high-RB mode, the combined sense current 102 would be higher as a result of the fast switcher circuitry 64 being activated. Thus, by setting the scaling factor to be less than one, it is possible to scale down the amount of the combined sense current 102 in the mid-RB mode and the high-RB mode. As a result, the slow switcher circuitry 62 can include less and smaller FETs (e.g., with thinner dielectric layer), thus helping to reduce parasitic capacitance in the slow switcher circuitry 62. In addition, by scaling down the amount of the combined sense current 102 in the mid-RB mode and the high-RB mode, the slow switcher circuitry 62 can operate at a lowest possible switching frequency. The combination of reduced parasitic capacitance and lowered switching frequency allows the slow switcher circuitry 62 to operate at a higher efficiency.

In a non-limiting example, the slow switcher controller 92 can determine the amount of the load current $I_{LOAD}$ at the output node 56 based on the scaled sense current 106 (e.g., based on a look-up table). As such, the slow switcher controller 92 can control the first DC-DC converter 72 to adjust the first DC voltage $V_{DC\_L}$ to increase or decrease the DC current $I_{SW\_L}$.

As previously discussed, the ET modulated target voltage $V_{TARGET}$ provides the target voltage envelope for the ET modulated voltage $V_{CC}$, which serves as a supply voltage to the power amplifier circuit 58 for amplifying the RF signal 60. In this regard, the ET modulated voltage $V_{CC}$ is configured to vary according to the amplitude variations of the RF signal 60 at the output node 56. Accordingly, the AC current $I_{SW\_S}$ also needs to vary according to the amplitude variations of the RF signal 60 to maximize operating efficiency of the multi-mode ET amplifier circuit 52.

However, active components (e.g., FETs, switching drivers, switches, and inductors) in the fast switcher controller 94 and the fast switcher circuitry 64 can introduce delays in the AC current $I_{SW\_S}$. For example, in the high-RB mode where the RF signal 60 includes more than 300 RBs, the AC current $I_{SW\_S}$ can be delayed by approximately one to two nanoseconds (1-2 ns), which can cause the multi-mode ET amplifier circuit 52 to lose two to three percent (2-3%) of efficiency. Hence, it may be desired to provide a timing advance in the AC current $I_{SW\_S}$ to mitigate the delay resulting from the fast switcher controller 94 and the fast switcher circuitry 64.

In this regard, the multi-mode ET amplifier circuit 52 further includes delay compensation circuitry 108 configured to mitigate a processing delay in the fast switcher controller 94 and the fast switcher circuitry 64. The delay compensation circuitry 108 is coupled to the ET tracker circuitry 54 and the fast switcher controller 94. The delay compensation circuitry 108 is configured to provide a timing advance in the AC current $I_{SW\_S}$ by delaying the ET modulated target voltage $V_{TARGET}$, thus compensating for the processing delay associated with the fast switcher circuitry 64 in the mid-RB mode and the high-RB mode. In a non-limiting example, the delay compensation circuitry 108 is configured to delay the ET modulated target voltage $V_{TARGET}$ by an estimated processing delay dT (e.g., 1-2 ns) associated with the fast switcher controller 94 and the fast switcher circuitry 64.

At any determined time t, the delay compensation circuitry 108 receives an advanced ET modulated target voltage $V'_{TARGET}$ that represents the ET modulated target voltage $E_{TARGET}$ at time t+dT. In this regard, the advanced ET modulated target voltage $V'_{TARGET}$ is a forward-looking sample of the ET modulated target voltage $V_{TARGET}$ at the time t+dT. The delay compensation circuitry 108 includes first delay circuitry 110 configured to delay the advanced ET modulated target voltage $V'_{TARGET}$ by the estimated processing delay dT to generate the ET modulated target voltage $V_{TARGET}$. The delay compensation circuitry 108 includes second delay circuitry 112 configured to delay the ET modulated target voltage $V_{TARGET}$ by the estimated processing delay dT to generate a delayed ET modulated target voltage $V''_{TARGET}$. In this regard, the delayed ET modulated target voltage $V''_{TARGET}$ is a backward-looking sample of the ET modulated target voltage $V_{TARGET}$ at the time t-dT.

The delay compensation circuitry 108 also includes current adjustment circuitry 114. The current adjustment circuitry 114 generates a differential current $\Delta I$ indicative of an estimated current change at the determined time t. In a non-limiting example, the current adjustment circuitry 114 determines the differential current $\Delta I$ based on the equations (Eq. 2.1, Eq. 2.2, and Eq. 2.3) below.

$$\Delta I_C = C/dT \times [V_{CC}(t-dT) - 2V_{CC}(t) + V_{CC}(t+dT)] \quad \text{(Eq. 2.1)}$$

$$\Delta I_{LOAD} = 1/R_{LOAD} \times [V_{CC}(t+dT) - V_{CC}(t)] \quad \text{(Eq. 2.2)}$$

$$\Delta I = \Delta I_C + \Delta I_{LOAD} \quad \text{(Eq. 2.3)}$$

In Eq. 2.1 $\Delta I_C$ represents an estimated current change relative to a bypass capacitor 116, and C represents total load capacitance of the power amplifier circuit 58. $V_{CC}(t-dT)$, $V_{CC}(t)$, and $V_{CC}(t+dT)$ represent estimates of the ET modulated voltage $V_{CC}$ at times t-dT, t, and t+dT, respectively. In Eq. 2.2, $\Delta I_{LOAD}$ represents an estimated current change relative to the load line $R_{LOAD}$ for the duration between t-dT and t+dT. In a non-limiting example, the total load capacitance C is typically known and does not change for a given design of the power amplifier circuit 58. The load line $R_{LOAD}$, on the other hand, will change from time to time to adapt to voltage standing wave ratio (VSWR) changes of the ET tracker circuitry 54. In a non-limiting example, the load line $R_{LOAD}$ can be determined based on a look-up table (LUT) of the ET tracker circuitry 54.

The multi-mode ET amplifier circuit 52 includes a second combiner 118. The second combiner 118 combines the differential current $\Delta I$ with the tracker sense current 98 to generate a delay-compensated sense current 120, and provide the delay-compensated sense current 120 to the fast switcher controller 94. The fast switcher controller 94 is configured to control the fast switcher circuitry 64 based on the delay-compensated sense current 120 to minimize the processing delay in the AC current $I_{SW\_S}$, thus helping to further improve the efficiency of the multi-mode ET amplifier circuit 52.

Notably, the multi-mode ET amplifier circuit 52 can include more than one of the ET tracker circuitry 54 for supporting concurrent RF signal transmissions such as uplink carrier aggregation (ULCA). In addition, the power amplifier circuit 58 can be provided as a differential power amplifier circuit including a driver stage amplifier and a differential output stage amplifier. In this regard, as described next in FIGS. 4 and 5, it may be possible to utilize the multiple ET tracker circuitries already existed in the multi-mode ET amplifier circuit 52 to provide the AC current $I_{AC}$ in the mid-RB mode and the high-RB mode using a single inductor, and thus a single switcher path, in the fast switcher circuitry 64. Understandably, eliminating a second switcher path from the fast switcher circuitry 64 can help reduce cost and implementation complexity.

Figure 4:
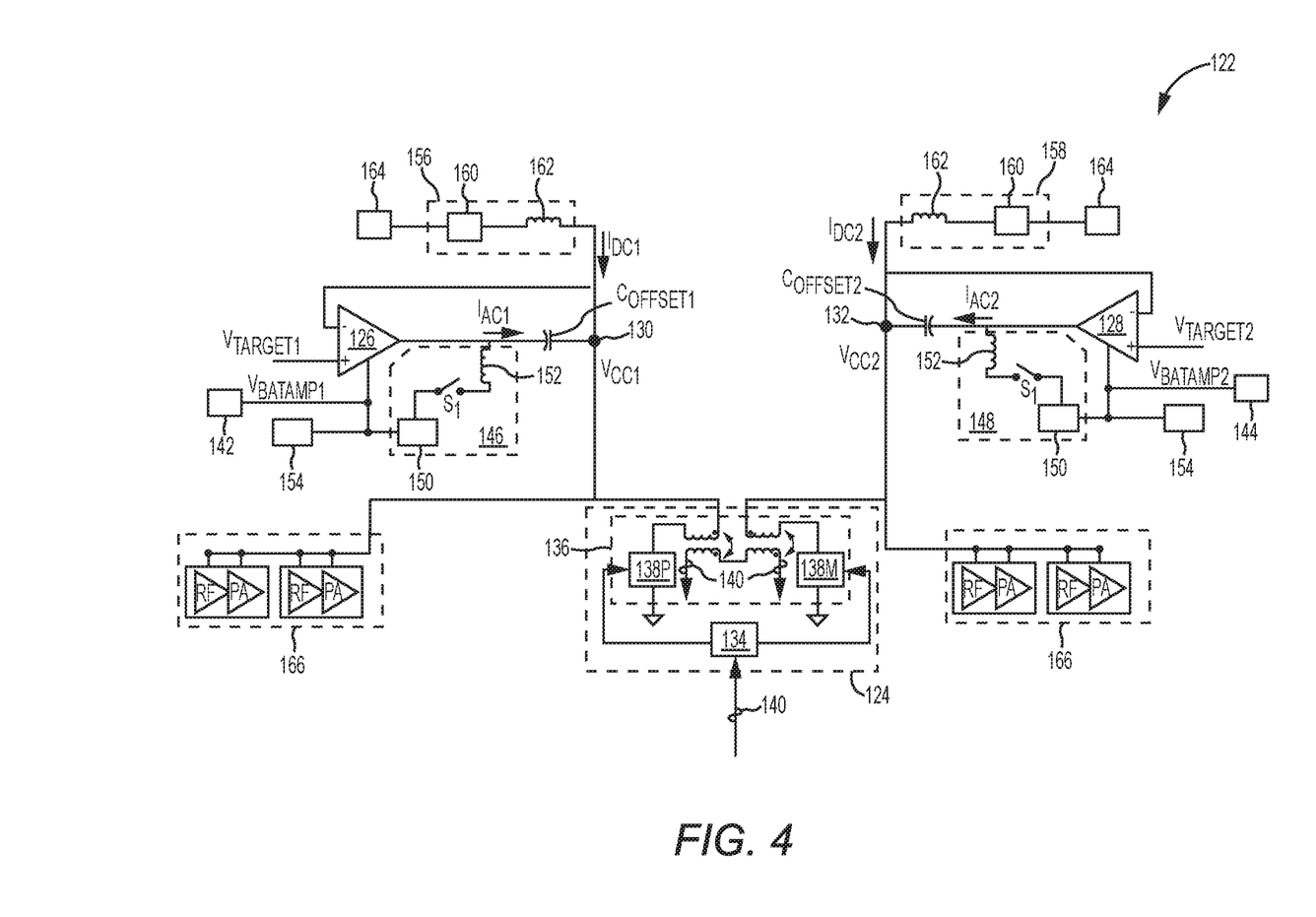
FIG. 4 is a schematic diagram of an exemplary multi-mode ET amplifier circuit configured to support at least one power amplifier circuit operating in low-RB mode, mid-RB mode, and high-RB mode based on first ET tracker circuitry and second ET tracker circuitry.

In this regard, FIG. 4 is a schematic diagram of an exemplary multi-mode ET amplifier circuit 122 configured to support at least one power amplifier circuit 124 operating in the low-RB mode, the mid-RB mode, and the high-RB mode based on first ET tracker circuitry 126 and second ET tracker circuitry 128. The multi-mode ET amplifier circuit 122 includes a first output node 130 and a second output node 132. In a non-limiting example, the power amplifier circuit 124 is a differential power amplifier circuit including a driver stage amplifier 134 and an output stage amplifier 136. The output stage amplifier 136 is a differential amplifier including a plus power amplifier 138P coupled to the first output node 130 and a minus power amplifier 138M coupled to the second output node 132. The power amplifier circuit 124 is configured to amplify an RF signal 140 based on a first ET modulated voltage $V_{CC1}$ received at the first output node 130 and a second ET modulated voltage $V_{CC2}$ received at the second output node 132. The first ET tracker circuitry 126 is coupled to the first output node 130 via a first offset capacitor $C_{OFFSET1}$ and the second ET tracker circuitry 128 is coupled to the second output node 132 via a second offset capacitor $C_{OFFSET2}$. The first ET tracker circuitry 126 is configured to provide the first ET modulated voltage $V_{CC1}$ to the first output node 130 based on a first ET modulated target voltage $V_{TARGET1}$ and a first supply voltage $V_{BATAMP1}$. The second ET tracker circuitry 128 is configured to provide the second ET modulated voltage $V_{CC2}$ to the second output node 132 based on a second ET modulated target voltage $V_{TARGET2}$ and a second supply voltage $V_{BATAMP2}$. The multi-mode ET amplifier circuit 122 includes a first inductor-based buck-boost circuit 142 to provide the first supply voltage $V_{BATAMP1}$ to the first ET tracker circuitry 126 and a second inductor-based buck-boost circuit 144 to supply the second supply voltage $V_{BATAMP2}$ to the second ET tracker circuitry 128.

The multi-mode ET amplifier circuit 122 includes first fast switcher circuitry 146 and second fast switcher circuitry 148. The first fast switcher circuitry 146 and the second fast switcher circuitry 148 each include a respective DC-DC converter 150, a respective inductor 152, and a respective switch $S_1$.

The multi-mode ET amplifier circuit 122 includes a fast switcher controller 154 to control the first fast switcher circuitry 146 and the second fast switcher circuitry 148. The fast switcher controller 154 activates the first fast switcher circuitry 146 and the second fast switcher circuitry 148 to provide a first AC current $I_{AC1}$ and a second AC current $I_{AC2}$ to the first output node 130 and the second output node 132, respectively, in the mid-RB mode and the high-RB mode. The fast switcher controller 154 deactivates the first fast switcher circuitry 146 and the second fast switcher circuitry 148 in the low-RB mode.

The multi-mode ET amplifier circuit 122 also includes first slow switcher circuitry 156 and second slow switcher circuitry 158. The first slow switcher circuitry 156 and the second slow switcher circuitry 158 each include a respective DC-DC converter 160 and a respective inductor 162. Notably, the respective inductor 162 has substantially higher inductance than the respective inductor 152. The multi-mode ET amplifier circuit 122 includes a slow switcher controller 164 to control the first slow switcher circuitry 156 and the second slow switcher circuitry 158. The slow switcher controller 164 activates the first slow switcher circuitry 156 and the second slow switcher circuitry 158 to provide a first DC current $I_{DC1}$ and a second DC current $I_{DC2}$ to the first output node 130 and the second output node 132, respectively, in the low-RB mode, the mid-RB mode, and the high-RB mode.

Notably, the first ET tracker circuitry 126 and the second ET tracker circuitry 128 can support additional power amplifier circuits 166 in other modes of operation such as ULCA, multiple-input multiple output (MIMO), and RF beamforming. The additional power amplifier circuits 166 may be serial power amplifier circuits and/or differential power amplifier circuits.

Figure 5:
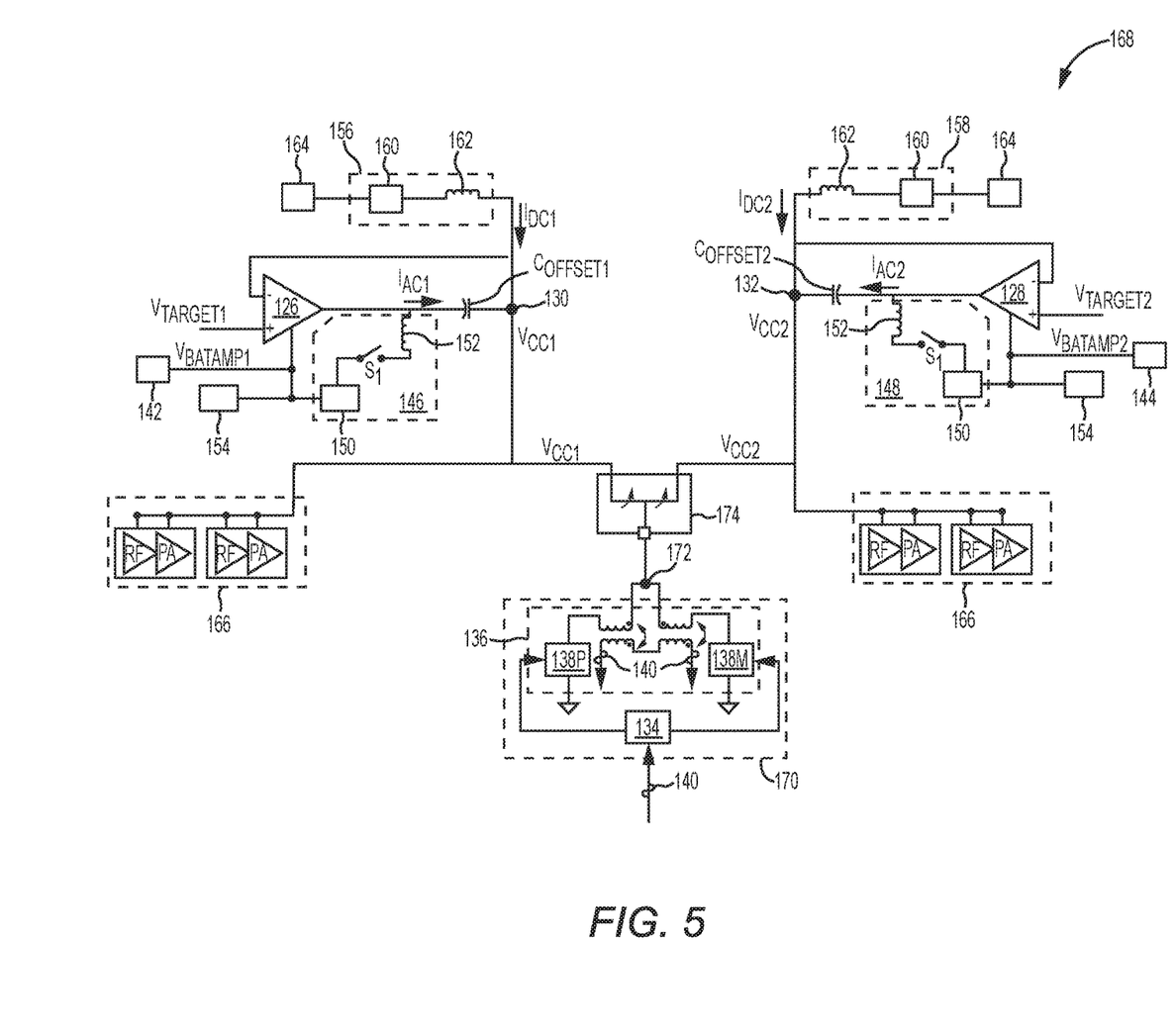
FIG. 5 is a schematic diagram of an exemplary multi-mode ET amplifier circuit configured to support at least one power amplifier circuit operating in low-RB mode, mid-RB mode, and high-RB mode according to an alternative embodiment.

FIG. 5 is a schematic diagram of an exemplary multi-mode ET amplifier circuit 168 configured to support at least one power amplifier circuit 170 operating in the low-RB mode, the mid-RB mode, and the high-RB mode according to an alternative embodiment. Common elements between FIGS. 4 and 5 are shown therein with common element numbers and will not be re-described herein.

The plus power amplifier 138P and the minus power amplifier 138M are coupled to a common node 172. The common node 172 is coupled to the first output node 130 and the second output node 132 via switching circuitry 174. In this regard, in the mid-RB mode and the high-RB mode, the fast switcher controller 154 may couple the first fast switcher circuitry 146, or the second fast switcher circuitry 148, or both the first fast switcher circuitry 146 and the second fast switcher circuitry 148 to the common node 172 by controlling the switching circuitry 174. When the fast switcher controller 154 couples the first fast switcher circuitry 146 to the common node 172, the first fast switcher circuitry 146 provides the first AC current $I_{AC1}$ to the common node 172. When the fast switcher controller 154 couples the second fast switcher circuitry 148 to the common node 172, the second fast switcher circuitry 148 provides the second AC current $I_{AC2}$ to the common node 172. When the fast switcher controller 154 couples both the first fast switcher circuitry 146 and the second fast switcher circuitry 148 to the common node 172, the first fast switcher circuitry 146 provides one-half (½) of the first AC current $I_{AC1}$ to the common node 172 and the second fast switcher circuitry 148 provides ½ of the second AC current $I_{AC2}$ to the common node 172. Notably, the switching circuitry 174 may already exist in the multi-mode ET amplifier circuit 168 for supporting other modes of operation (e.g., ULCA, MIMO, RF beamforming). In this regard, the switching circuitry 174 is reconfigured to support the mid-RB mode and the high-RB mode in addition to supporting the existing mode of operations.

Those skilled in the art will recognize improvements and modifications to the embodiments of the present disclosure. All such improvements and modifications are considered within the scope of the concepts disclosed herein and the claims that follow.

What is claimed is:

1. A multi-mode envelope tracking (ET) amplifier circuit comprising:
    an output node;
    at least one power amplifier circuit coupled to the output node and configured to amplify a radio frequency (RF) signal;
    ET tracker circuitry configured to provide an ET modulated voltage to the output node;
    fast switcher circuitry comprising a first switcher path and a second switcher path and configured to generate an alternate current (AC) current; and
    a control circuit configured to activate the fast switcher circuitry to provide the AC current to the output node via the first switcher path and the second switcher path in a high-resource block (RB) mode.

2. The multi-mode ET amplifier circuit of claim 1 wherein the control circuit is further configured to:
    deactivate the fast switcher circuitry in a low-RB mode; and
    activate the fast switcher circuitry to provide the AC current to the output node via a selected switcher path among the first switcher path and the second switcher path in a mid-RB mode.

3. The multi-mode ET amplifier circuit of claim 2 wherein:
    in the low-RB mode, the RF signal comprises less than or equal to one hundred RBs;
    in the mid-RB mode, the RF signal comprises more than one hundred RBs and less than three hundred RBs; and
    in the high-RB mode, the RF signal comprises greater than or equal to three hundred RBs.

4. The multi-mode ET amplifier circuit of claim 2 further comprising slow switcher circuitry configured to generate a direct current (DC) current, wherein the control circuit is further configured to activate the slow switcher circuitry to provide the DC current to the output node in the low-RB mode, the mid-RB mode, and the high-RB mode.

5. The multi-mode ET amplifier circuit of claim 4 wherein the slow switcher circuitry is further configured to provide the AC current to the output node in the low-RB mode.

6. The multi-mode ET amplifier circuit of claim 5 wherein the at least one power amplifier circuit is further configured to amplify the RF signal to a determined power based on the ET modulated voltage, the AC current, and the DC current at the output node in the low-RB mode, the mid-RB mode, and the high-RB mode.

7. The multi-mode ET amplifier circuit of claim 4 wherein:
    the first switcher path comprises a first DC-DC converter and a first inductor having a first inductance, the first inductor configured to generate the AC current;

the second switcher path comprises the first DC-DC converter and a second inductor having a second inductance, the second inductor configured to generate the AC current; and the slow switcher circuitry comprises a second DC-DC converter and a third inductor having a third inductance higher than the first inductance and the second inductance.

8. The multi-mode ET amplifier circuit of claim 7 wherein the first inductance equals or differs from the second inductance.

9. The multi-mode ET amplifier circuit of claim 7 further comprising an offset capacitor configured to couple the ET tracker circuitry, the first switcher path, and the second switcher path to the output node.

10. The multi-mode ET amplifier circuit of claim 9 wherein the control circuit comprises:
   a slow switcher controller coupled to the slow switcher circuitry and configured to activate the slow switcher circuitry in the low-RB mode and the high-RB mode; and
   a fast switcher controller coupled to the fast switcher circuitry and configured to:
     activate the selected switcher path in the mid-RB mode;
     activate the first switcher path and the second switcher path in the high-RB mode; and
     deactivate the fast switcher circuitry in the low-RB mode.

11. The multi-mode ET amplifier circuit of claim 10 wherein the fast switcher controller is further configured to:
   activate the fast switcher circuitry in response to the ET tracker circuitry sourcing the AC current to the output node; and
   deactivate the fast switcher circuitry in response to the ET tracker circuitry sinking the AC current from the output node.

12. The multi-mode ET amplifier circuit of claim 11 wherein:
   the fast switcher circuitry is further configured to generate a switcher sense current in proportion to the AC current generated by the fast switcher circuitry; and
   the ET tracker circuitry is further configured to generate a tracker sense current in proportion to the AC current sourced or sunk by the ET tracker circuitry, wherein:
     the tracker sense current is a positive current in response to the ET tracker circuitry sourcing the AC current; and
     the tracker sense current is a negative current in response to the ET tracker circuitry sinking the AC current.

13. The multi-mode ET amplifier circuit of claim 12 wherein the fast switcher controller is further configured to:
   receive the tracker sense current from the ET tracker circuitry;
   control the fast switcher circuitry to increase the AC current in response to the tracker sense current being the positive current; and
   control the fast switcher circuitry to reduce the AC current in response to the tracker sense current being the negative current.

14. The multi-mode ET amplifier circuit of claim 13 wherein the fast switcher controller is further configured to:
   activate the selected switcher path between the first switcher path and the second switcher path in response to the tracker sense current being higher than a first positive current threshold and lower than a second positive current threshold that is higher than the first positive current threshold;
   activate the first switcher path and the second switcher path in response to the tracker sense current being higher than the second positive current threshold; and
   deactivate the first switcher path and the second switcher path in response to the tracker sense current being lower than the first positive current threshold.

15. The multi-mode ET amplifier circuit of claim 13 wherein the slow switcher controller is further configured to:
   receive the tracker sense current from the ET tracker circuitry;
   receive the switcher sense current from the fast switcher circuitry; and
   control the slow switcher circuitry to adjust the DC current based on the switcher sense current and the tracker sense current.

16. The multi-mode ET amplifier circuit of claim 10 further comprising delay compensation circuitry coupled to the ET tracker circuitry and the fast switcher controller, the delay compensation circuitry configured to compensate for a processing delay associated with the fast switcher controller and the fast switcher circuitry.

* * * * *